United States Patent [19]

Chou

[11] Patent Number: 5,867,048
[45] Date of Patent: Feb. 2, 1999

[54] PULSE-WIDTH CONTROLLER FOR SWITCHING REGULATORS

[75] Inventor: Tzu-Hsun Chou, Kaohsiung, Taiwan

[73] Assignee: Advanced Reality Technology Inc., Taiwan

[21] Appl. No.: 900,706

[22] Filed: Jul. 25, 1997

[30] Foreign Application Priority Data

Mar. 24, 1997 [TW] Taiwan .................................. 86204539

[51] Int. Cl.$^6$ ............................. H03K 3/017; H03K 7/08
[52] U.S. Cl. .......................... 327/172; 327/173; 327/174; 327/291
[58] Field of Search .................................. 327/172, 173, 327/174, 291, 298

[56] References Cited

U.S. PATENT DOCUMENTS

| | | | |
|---|---|---|---|
| 4,591,736 | 5/1986 | Hirao et al. ................................. | 327/91 |
| 4,594,578 | 6/1986 | Walsh ................................ | 340/347 AD |
| 5,291,562 | 3/1994 | Hata ......................................... | 382/41 |

Primary Examiner—Timothy P. Callahan
Assistant Examiner—An T. Luu
Attorney, Agent, or Firm—Rabin & Champagne, P.C.

[57] ABSTRACT

A pulse-width controller for a switching regulator is provided. The pulse-width controller is coupled to a bulk regulator in the switching regulator to control the bulk regulator to produce an output voltage in a fixed level and an output current in a desired level in response to various demands from the load. The pulse-width controller takes a voltage of feedback-voltage indicative of a change in the output voltage of the bulk regulator and a first voltage of feedback-current and a second voltage of feedback-current indicative of a change in the output current of the bulk regulator as feedback signals. These feedback signals can cause the pulse-width controller to produce a square-wave signal with an adaptive pulse width that controls the bulk regulator to produce the output voltage and current in the desired levels. The circuit configuration of the pulse-width controller allows an increase in the gain bandwidth and a decrease in gain sensitivity without taking up much circuit layout area in integrated circuit.

18 Claims, 4 Drawing Sheets

PULSE-WIDTH CONTROLLER FOR SWITCHING REGULATORS

BACKGROUND OF THE INVENTION

1. Field of the Invention

This invention relates to switching regulars, and more particularly, to a pulse-width controller for use in a switching regulator for pulse width modulation of a square-wave signal used to control the output of the switching regulator.

2. Description of Related Art

FIG. 1 is a schematic circuit diagram of a conventional switching regulator. As shown, this switching regulator includes a controller 100a and a bulk regulator 100b. The controller 100a is composed of an amplifier 10a, a comparator 10b, and an oscillator 10c. The oscillator 10c is used to generate a triangle-wave signal. The output power of the switching regulator is dependent on the duty cycle of a square-wave signal generated by the controller 100a, and this-square-wave signal is applied to a switching transistor $Q_1$ in the bulk regulator 100b. The output power of the bulk regulator 100b is proportional to the pulse width of this square-wave signal. To provide feedback control of the square-wave signal, the output voltage $V_O$ of the bulk regulator 100b is divided by a pair of resistors $R_1$, $R_2$ to obtained an apportioned feedback voltage $V_{feedback}$ which is then fed back to the amplifier 10a. The amplifier 10a takes both $V_{feedback}$ and a reference voltage $V_{ref}$ as inputs so as to amplify the difference between these two signals. The output of the amplifier 10a is compared by the comparator 10b with the triangle-wave output of the oscillator 10c to thereby generate a square-wave signal to control the switching transistor $Q_1$. When the output voltage $V_O$ falls below the desired level, the fall will be indicated by a drop in $V_{feedback}$ that then causes the controller 100a to increase the duty cycle of the square-wave output of the comparator 10b, thereby increasing the level of the output voltage $V_O$ until it reaches the desired level. On the other hand, when the output voltage $V_O$ rises above the desired level, the rise in $V_{feedback}$ can cause the controller 100a to decrease the duty cycle of the square-wave output of the comparator 10b, thereby decreasing the level of the output voltage $V_O$ until it reaches the desired level. This allows the switching regulator to output a fixed output voltage $V_O$. The fixed level of the output voltage $V_O$ can be adjusted by varying the ratio $R_2/R_1$ and the reference voltage $V_{ref}$.

One drawback to the foregoing switching regulator, however, is that its dynamic characteristics are not quite satisfactory since it has output voltage feedback only and no output current feedback.

FIG. 2 is a schematic circuit diagram of another conventional switching regulator As shown, this switching regulator differs from the one of FIG. 1 in that this switching regulator further includes two feedback networks 20a, 20b. The first feedback network 20a connects the output end of the amplifier 10a back to one input end of the same; while the second feedback network 20b connects the output voltage $V_O$ back to one input end of the amplifier 10a and also via the first feedback network 20a to one input end of the comparator 10b that is connected to the output of the amplifier 10a. These two feedback networks 20a, 20b are both configured with resistors and capacitors. These capacitors are large in capacitance that can allow an increase in the gain bandwidth of the switching regulator.

One drawback to the foregoing switching regulator, however, is that, since the feedback networks 20a, 20b include large-capacitance capacitors to build, the integrated circuit implementing the switching regulator will take up large space in circuit layout area. This drawback will reduce the cost-effectiveness in the manufacture of the switching regulator.

SUMMARY OF THE INVENTION

It is therefore a primary objective of the present invention to provide a pulse-width controller for a switching regulator which allows the switching regulator to have improved dynamic characteristics by providing both output voltage feedback and output current feedback in the switching regulator.

It is another objective of the present invention to provide a pulse-width controller for a switching regulator in which large-capacitance capacitors are not used so that the switching regulator can take up only a small circuit layout area in integrated circuit.

In accordance with the foregoing and other objectives of the present invention, an improved pulse-width controller for a switching regulator is provided. The switching regulator has a bulk regulator for producing an output voltage in a fixed level and an output current in a desired level, and the pulse-width controller is used to control the bulk regulator. From the bulk regulator, a voltage of feedback-voltage indicative of a change in the output voltage of the bulk regulator and a first voltage of feedback-current and a second voltage of feedback-current indicative of a change in the output current of the bulk regulator are obtained.

The pulse-width controller includes an operational transconductance amplifier, which has a negative input end receiving a first reference voltage and a positive input end receiving the voltage of feedback-voltage, for producing a first output current proportional to the difference between the first reference voltage and the voltage of feedback-voltage. A differential voltage-input current-output amplifier, which has a negative input end receiving first voltage of feedback-current and a positive input end receiving the second voltage of feedback-current, is used to produce a second output current proportional to the difference between the first voltage of feedback-current and the second voltage of feedback-current. An operational amplifier, which has a negative input end connected both to the output of the operational transconductance amplifier and the output of the differential amplifier and a positive input end receiving a second reference voltage, is used to produce an output voltage in relation to the inputs to the negative input end and positive input end thereof.

A feedback network is connected between the output of the operational amplifier and the negative input end of the operational amplifier. A comparator, which has a negative input end connected to the output of the operational amplifier and a positive input end connected to a triangle-wave signal, is used to produce a square-wave signal with a pulse width in relation to the voltage of feedback-voltage, the first voltage of feedback-current, and the second voltage of feedback-current from the bulk regulator.

The output of the comparator is input to the bulk regulator so as to cause the bulk regulator to produce an output voltage in proportion to the pulse width of the output square-wave signal from the comparator.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 3:
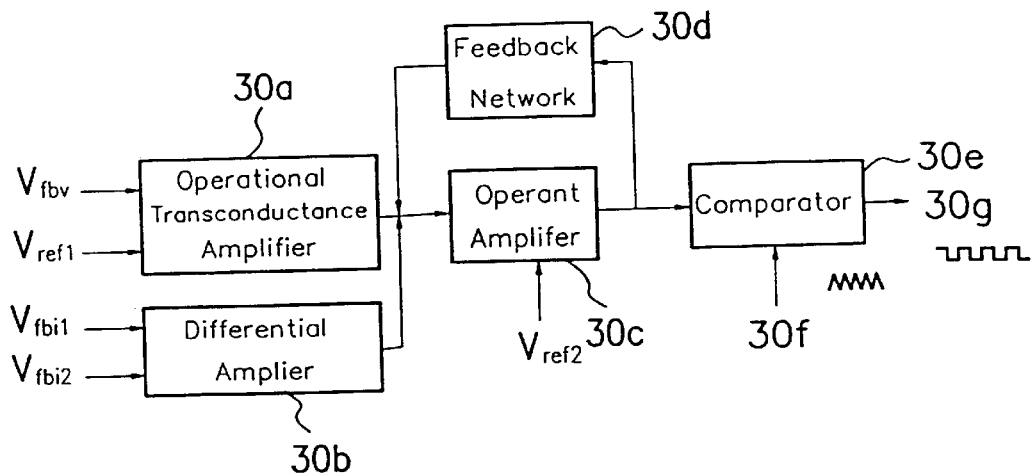
FIG. 3 is a schematic block diagram of the pulse-width controller according to the invention.

FIG. 3 is a schematic block diagram of the pulse-width controller according to the invention. As shown, this pulse-width controller includes an operational transconductance amplifier 30a, a differential amplifier 30b, an operational amplifier 30c, a feedback network 30d, and a comparator 30e. The operational transconductance amplifier 30a has two inputs respectively receiving a voltage of feedback-voltage $V_{fbv}$ and a first reference voltage $V_{ref1}$. The differential amplifier 30b has two inputs respectively receiving a first voltage of feedback-current $V_{fbi1}$ and a second voltage of feedback-current $V_{fbi2}$. The operational amplifier 30c has two inputs: a first input connected to a node where the output of the operational transconductance amplifier 30a, the output of the differential amplifier 30b, and the output of the feedback network 30d are tied together, and a second end connected to a second reference voltage $V_{ref2}$. The feedback network 30d connects the output of the operational amplifier 30c back to the input of the same. The comparator 30e has two inputs respectively receiving the output of the operational amplifier 30c and a triangle-wave signal 30f to thereby generate a square-wave signal 30g.

The differential amplifier 30b can be a differential voltage-input current-output amplifier which generates a current output in response to the two voltage inputs $V_{fbi1}$ and $V_{fbi2}$. The pulse width of the square-wave signal 30g can be adjusted by varying the value of ($V_{ref1}-V_{fbv}$), i.e., the difference between the voltage of feedback-voltage $V_{fbv}$ and the first reference voltage $V_{ref1}$ and the value of ($V_{fbi2}-V_{fbi1}$), i.e., the difference between the first voltage of feedback-current $V_{fbi1}$ and the second voltage of feedback-current $V_{fbi2}$.

Figure 4:
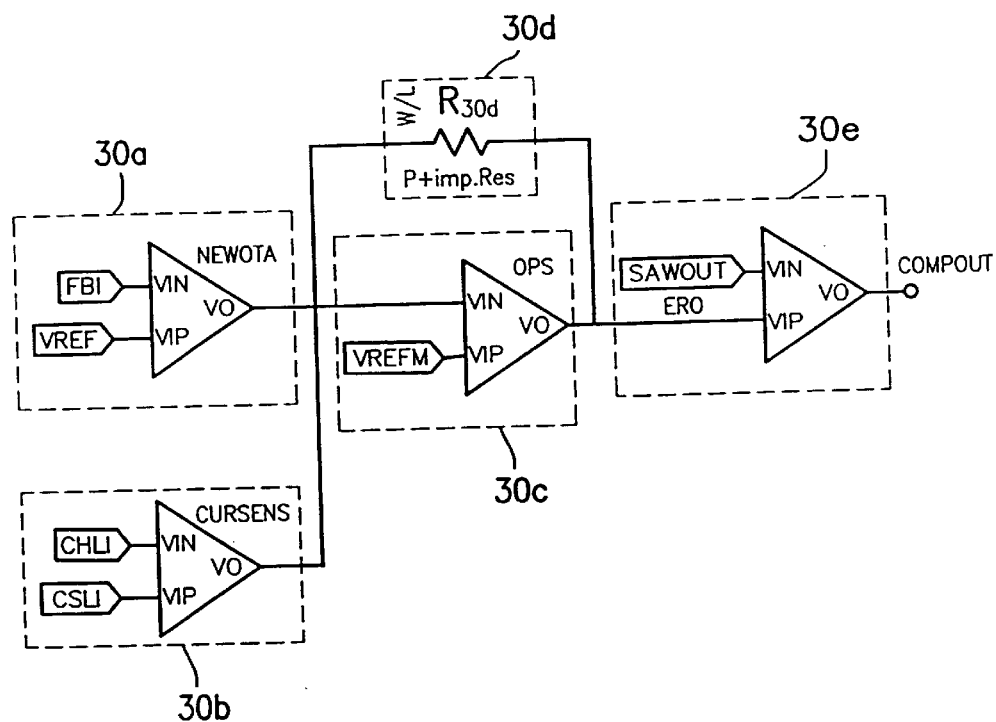
FIG. 4 shows a practical implementation of the pulse-width controller of FIG. 3.

Referring to FIG. 4, the pulse-width controller of FIG. 3 can be implemented in such a manner that the feedback network 30d includes only a single resistor $R_{30d}$. This feedback network 30d allows for a decreased gain sensitivity and an increased gain bandwidth for the switching regulator. Compared to In comparison with the prior art which uses large-capacitance capacitors to provide large gain bandwidth, the use of the amplifier in conjunction with the negative feedback resistor $R_{30d}$ allows the integrated circuit that accommodates the switching regulator to be small in circuit layout area. This advantage allows the pulse-width controller of the invention to be manufactured in a cost-effective manner.

Figure 1:
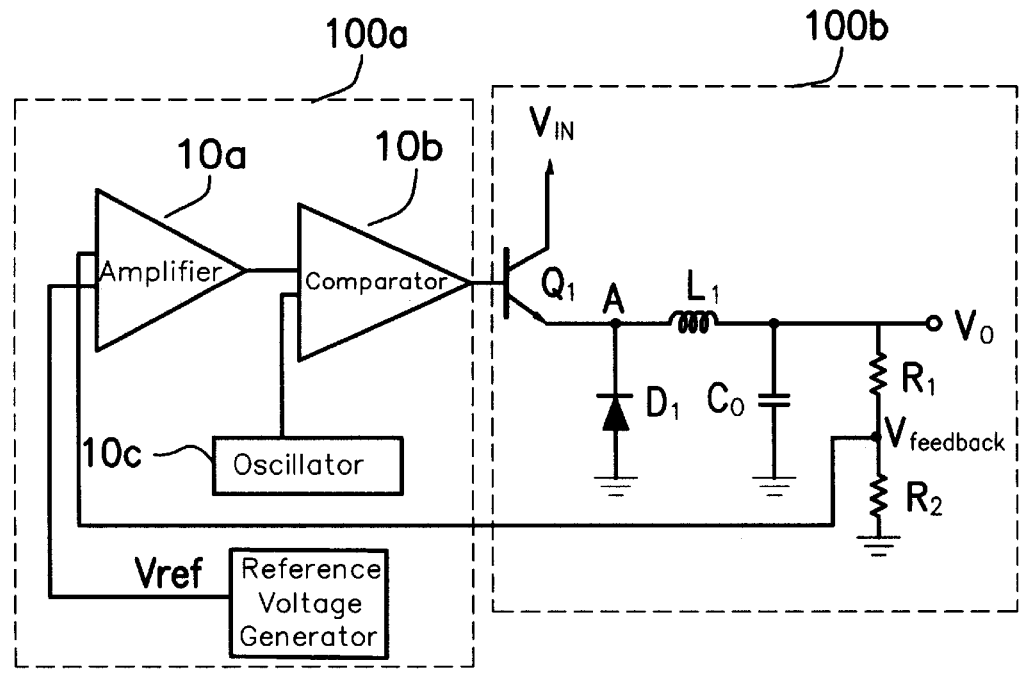
FIG. 1 is a schematic circuit diagram of a conventional switching regulator.
Figure 2:
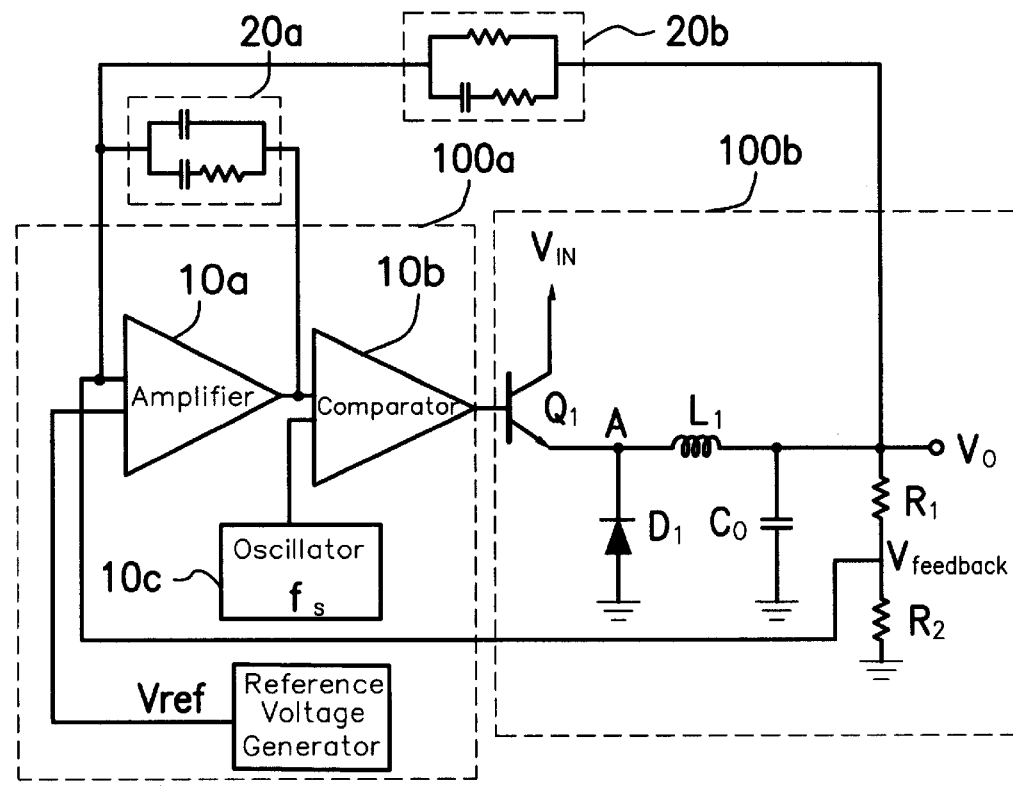
FIG. 2 is a schematic circuit diagram of another conventional switching regulator.
Figure 5:
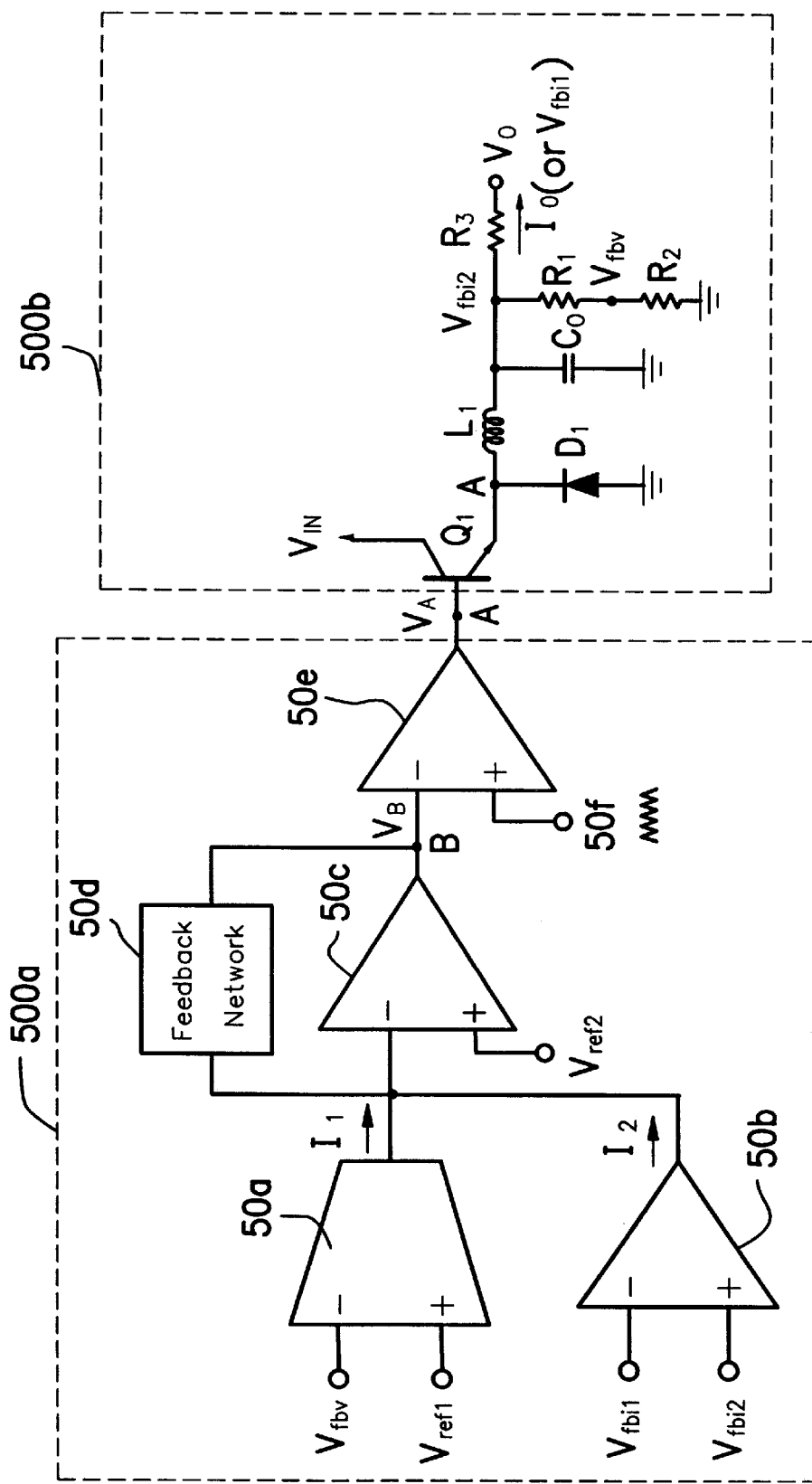
FIG. 5 is a schematic circuit diagram depicting the combination of the pulse-width controller of the invention with a bulk regulator to constitute a switching regulator.

FIG. 5 is a schematic circuit diagram depicting the combination of the pulse-width controller of the invention (here enclosed in a dashed box designated by the reference numeral 500a) with a bulk regulator (designated by the reference numeral 500b) to constitute a switching regulator. The pulse-width controller includes an operational transconductance amplifier 50a, a differential amplifier 50b, an operational amplifier 50c, a feedback network 50d, and a comparator 50e (these elements are labeled with different reference numerals but they designate the same elements as labeled respectively by 30a, 30b, 30c, 30d, 30e in FIG. 1). Compared to the bulk regulator 100b in the prior art, the bulk regulator 500b here additionally includes a resistor $R_3$, with the potentials at both ends of the resistor $R_3$ serving respectively as the first voltage of feedback-current $V_{fbi1}$ and the second voltage of feedback-current $V_{fbi2}$. The voltage of feedback-voltage $V_{fbv}$ is obtained in a similar manner as in the prior art, i.e., by means of dividing the potential $V_{fbi2}$ connected via the inductor $L_1$ to the output of the transistor $Q_1$.

The output of the pulse-width controller 500a, which is a square-wave signal, is input to the bulk regulator 500b so as to control the output voltage $V_O$ of the bulk regulator 500b to maintain stably at a fixed level. From the bulk regulator 500b, the output voltage $V_O$ is directly taken as the first voltage of feedback-current $V_{fbi1}$; the potential at a node connected via a inductor $C_1$ to the output of the transistor $Q_1$ is taken as the second voltage of feedback-current $V_{fbi2}$; and one apportioned potential of $V_{fbi2}$ divided by a pair of resistors $R_1$, $R_2$ is taken as the voltage of feedback-voltage $V_{fbv}$. As described earlier, the voltages $V_{fbi1}$ and $V_{fbi2}$ are fed back to the differential amplifier 50b, while the first voltage of feedback-current $V_{fbi1}$ is fed back to the operational transconductance amplifier 50a. These feedback voltages can cause the pulse-width controller 500a to adjust the output at the node A.

The operational transconductance amplifier 50a has a negative input end (−) receiving the voltage of feedback-voltage $V_{fbv}$ and a positive input end (+) receiving the first reference voltage $V_{ref1}$. In response to $V_{fbv}$ and $V_{ref1}$, the operational transconductance amplifier 50a produces a first output current $I_1$.

The differential amplifier 50b has a negative input end (−) receiving the first voltage of feedback-current $V_{fbi1}$ and a positive input end (+) receiving the second voltage of feedback-current $V_{fbi2}$. In response to $V_{fbi1}$ and $V_{fbi2}$, the differential amplifier 50b produces a second output current $I_2$.

The operational amplifier 30c has a negative input end (−) connected to a node where the output current $I_1$ of the operational transconductance amplifier 50a, the output current $I_2$ of the differential amplifier 50b, and one end of the feedback network 50d are tied together, and a positive input end (+) receiving the second reference voltage $V_{ref2}$. In response to the two inputs, the operational amplifier 50c produces an output voltage $V_B$ at a node B. Through the feedback network 50d, the output voltage $V_B$ of the operational amplifier 50c is fed back to the negative input end (−) of the operational amplifier 50c.

The comparator 50e takes the output voltage $V_B$ of the operational amplifier 50c and a triangle-wave signal 50f as inputs. In response to $V_B$ and the triangle-wave signal 50f, the comparator 50e produces a square-wave signal $V_A$ at the node A.

It is to be noted that the inputs to the negative input end (−) and positive input end (+) of the operational transconductance amplifier 50a and differential amplifier 50b can be interchanged. This will only cause an inversion of the output voltage $V_B$ and no influence to the overall operation and result of the switching regulator.

In the circuit of FIG. 5, assume the amplification gain of the operational transconductance amplifier 50a is $A_1$, the amplification gain of the differential amplifier 50b is $A_2$, and the impedance of the feedback network 50d is Z, then $$(V_B - V_{ref2})/Z + I_1 + I_2 = 0$$

hus $$V_B = Z(-I_1 - I_2) + V_{ref2}$$
$$= Z\{A_1(V_{fbv} - V_{ref1}) + A_2(V_{fbi1} - V_{fbi2})\} + V_{ref2}$$

Figure 6:
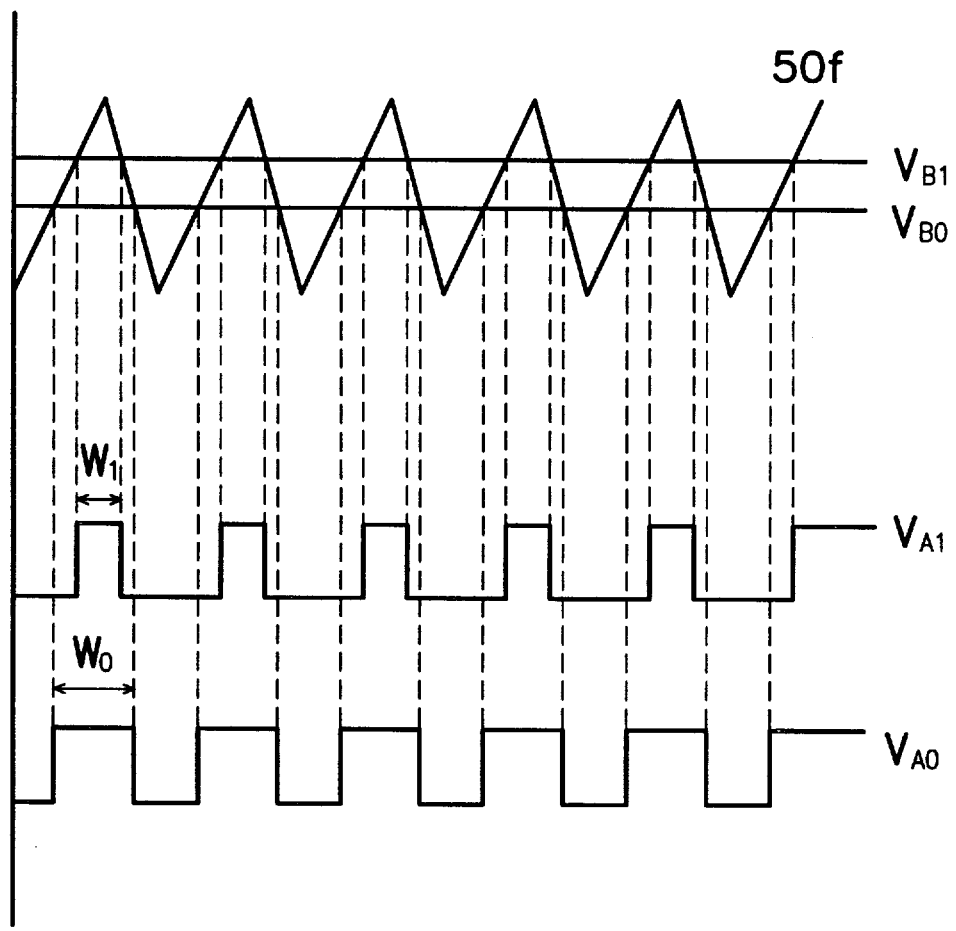
FIG. 6 is a waveform diagram showing the relationship between input and output waveforms of a comparator used in the pulse-width controller of the invention.

FIG. 6 is a waveform diagram showing the relationship between the output square-wave signal $V_A$ of the comparator 50e and the output voltage $V_B$ of the operational amplifier 50c. Referring also to FIG. 5, during the times when the triangle-wave signal 50f swings to a level higher than $V_B$, the comparator 50e will output a fixed high voltage; and during other times when the triangle-wave signal 50f swings to a level lower than $V_B$, the comparator 50e will output a fixed low voltage. If the inputs to the comparator 50e are interchanged, the foregoing output is inverted in phase; but this will not affect the overall operation and result of the switching regulator.

Assume the potential at the node B is initially $B_{B0}$. When the output voltage $V_O$ of the bulk regulator 500b rises above the desired level, the voltage of feedback-voltage $V_{fbv}$ is correspondingly raised. From the foregoing equation, it can be learned that $V_B$ will be raised from $B_{B0}$ to $V_{B1}$, causing $V_A$ to be reshaped from $V_{A0}$ having a pulse width $W_0$ into $V_{A1}$ having a narrowed pulse width $W_1$, where $W_1 < W_0$. The duty cycle of the square-wave signal $V_A$ input to the transistor $Q_1$ is thus decreased, which then causes a corresponding decrease in the output voltage $V_O$ of the bulk regulator 500b until the output voltage $V_O$ returns to the desired level.

On the other hand, when the output voltage $V_O$ of the bulk regulator 500b falls below the desired level, the voltage of feedback-voltage $V_{fbv}$ is correspondingly lowered. From the foregoing equation, it can be learned that the duty cycle of the square-wave signal $V_A$ input to the transistor $Q_1$ is correspondingly increased, which then causes a corresponding increase in the output voltage $V_O$ of the bulk regulator 500b until the output voltage $V_O$ returns to the desired level. This allows the output voltage $V_O$ of the bulk regulator 500b to be maintained stably at the desired fixed level.

Assume the potential at the node B is initially $V_{B1}$. When the load (not shown) of the bulk regulator 500b demands a larger output current $I_O$, the difference between the first voltage of feedback-current $V_{fbi1}$ and the second voltage of feedback-current $V_{fbi2}$ (i.e., $V_{fbi1} - V_{fbi2}$) will be decreased. From the foregoing equation, it can be learned that the output voltage $V_B$ of the operational amplifier 50c will be lowered from $V_{B1}$ to $V_{B2}$, causing the square-wave signal $V_A$ to be reshaped from $V_{A1}$ to $V_{A0}$, thereby increasing the pulse width of the square-wave signal $V_A$ from $W_1$ to $W_0$. The duty cycle of the square-wave signal $V_A$ input to the transistor $Q_1$ is thus increased, which then causes a corresponding increase in the output current $I_o$ of the bulk regulator 50b to meet the demand of the load.

On the other hand, when the load (not shown) of the bulk regulator 500b demands a smaller output current $I_O$, it can be deduced in a similar way that the duty cycle of the square-wave signal $V_A$ input to the transistor $Q_1$ will be decreased, which then causes a corresponding decrease in the output current $I_O$ of the bulk regulator 500b to meet the demand of the load.

In conclusion, the invention provides several advantages over the prior art. First, the use of the amplifier in conjunction with the negative feedback resistor $R_{30d}$ allows the integrated circuit that accommodates the pulse-width controller to be small in layout area, such that the pulse-width controller of the invention to be manufactured in a cost-effective manner. Second, the pulse-width controller of the invention allows the switching regulator to stabilize the output voltage and current by means of output voltage feedback and output current feedback so that the dynamic characteristics of the switching regulator is increased. Third, when the inputs to the differential amplifier 50b reach saturation, the, output current $I_O$ is maintained at a fixed output level, which can prevent the output current $I_O$ from being overly large that can damage the circuit elements in the load.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A switching regulator, comprising:

a bulk regulator for producing an output voltage in a fixed level and an output current in a desired level;

means for obtaining a voltage of feedback-voltage indicative of a change in the output voltage of the bulk regulator;

means for obtaining a first voltage of feedback-current and a second voltage of feedback-current indicative of a change in the output current of the bulk regulator;

an operational transconductance amplifier, which has a negative input end receiving a first reference voltage and a positive input end receiving the voltage of feedback-voltage, for producing a first output current proportional to the difference between the first reference voltage and the voltage of feedback-voltage;

a differential voltage-input current-output amplifier, which has a negative input end receiving the first voltage of feedback-current and a positive input end receiving the second voltage of feedback-current, for producing a second output current proportional to the difference between the first voltage of feedback-current and the second voltage of feedback-current;

an operational amplifier, which has a negative input end connected both to the output of said operational transconductance amplifier and the output of said differential amplifier and a positive input end receiving a second reference voltage, for producing an output voltage in relation to the inputs to the negative input end and positive input end thereof;

a feedback network connecting the output of the operational amplifier to the negative input end of said operational amplifier; and a comparator, which has a negative input end connected to the output of said operational amplifier and a positive input end connected to a triangle-wave signal, for producing a square-wave signal with a pulse width in relation to the voltage of feedback-voltage, the first voltage of feedback-current, and the second voltage of feedback-current from the bulk regulator, the output of said comparator being input to the bulk regulator so as to cause the bulk regulator to produce an output voltage in proportion to the pulse width of the output square-wave signal from said comparator.

2. The switching regulator of claim 1, wherein said feedback network is a resistor.

3. A pulse-width controller for use in a switching regulator having a bulk regulator for producing an output voltage in a fixed level and an output current in a desired level, comprising:

means for obtaining a voltage of feedback-voltage indicative of a change in the output voltage of the bulk regulator;

means for obtaining a first voltage of feedback-current and a second voltage of feedback-current indicative of a change in the output current of the bulk regulator;

an operational transconductance amplifier, which has a negative input end receiving a first reference voltage and a positive input end receiving the voltage of feedback-voltage, for producing a first output current proportional to the difference between the first reference voltage and the voltage of feedback-voltage;

a differential voltage-input current-output amplifier, which has a negative input end receiving the first voltage of feedback-current and a positive input end receiving the second voltage of feedback-current, for producing a second output current proportional to the difference between the first voltage of feedback-current and the second voltage of feedback-current;

an operational amplifier, which has a negative input end connected both to the output of said operational transconductance amplifier and the output of said differential amplifier and a positive input end receiving a second reference voltage, for producing an output voltage in relation to the inputs to the negative input end and positive input end thereof;

a feedback network connecting the output of the operational amplifier to the negative input end of said operational amplifier; and a comparator, which has a negative input end connected to the output of said operational amplifier and a positive input end connected to a triangle-wave signal, for producing a square-wave signal with a pulse width in relation to the voltage of feedback-voltage, the first voltage of feedback-current, and the second voltage of feedback-current from the bulk regulator, the output of said comparator being input to the bulk regulator so as to cause the bulk regulator to produce an output voltage in proportion to the pulse width of the output square-wave signal from said comparator.

4. The pulse-width controller of claim 3, wherein said feedback network is a resistor.

5. A switching regulator, comprising:

a bulk regulator for producing an output voltage in a fixed level and an output current in a desired level;

means for obtaining a voltage of feedback-voltage indicative of a change in the output voltage of the bulk regulator;

means for obtaining a first voltage of feedback-current and a second voltage of feedback-current indicative of a change in the output current of the bulk regulator;

an operational transconductance amplifier, which has a negative input end receiving a first reference voltage and a positive input end receiving the voltage of feedback-voltage, for producing a first output current proportional to the difference between the first reference voltage and the voltage of feedback-voltage;

a differential amplifier, which has a negative input end receiving the first voltage of feedback-current and a positive input end receiving the second voltage of feedback-current, for producing a second output current proportional to the difference between the first voltage of feedback-current and the second voltage of feedback-current;

an operational amplifier, which has a negative input end connected both to the output of said operational transconductance amplifier and the output of said differential amplifier and a positive input end receiving a second reference voltage, for producing an output voltage in relation to the inputs to the negative input end and positive input end thereof;

a feedback network connecting the output of the operational amplifier to the negative input end of said operational amplifier; and a comparator, which has a negative input end connected to the output of said operational amplifier and a positive input end connected to a triangle-wave signal, for producing a square-wave signal with a pulse width in relation to the voltage of feedback-voltage, the first voltage of feedback-current, and the second voltage of feedback-current from the bulk regulator, the output of said comparator being input to the bulk regulator so as to cause the bulk regulator to produce an output voltage in proportion to the pulse width of the output square-wave signal from said comparator.

6. The pulse-width controller of claim 5, wherein said feedback network is a resistor.

7. The pulse-width controller of claim 5, wherein said differential amplifier is a differential voltage-input current-output amplifier.

8. A pulse-width controller for use in a switching regulator having a bulk regulator for producing an output voltage in a fixed level and an output current in a desired level, comprising:

means for obtaining a voltage of feedback-voltage indicative of a change in the output voltage of the bulk regulator;

means for obtaining a first voltage of feedback-current and a second voltage of feedback-current indicative of a change in the output current of the bulk regulator;

an operational transconductance amplifier, which has a negative input end receiving a first reference voltage and a positive input end receiving the voltage of feedback-voltage, for producing a first output current proportional to the difference between the first reference voltage and the voltage of feedback-voltage;

a differential amplifier, which has a negative input end receiving the first voltage of feedback-current and a positive input end receiving the second voltage of feedback-current, for producing a second output current proportional to the difference between the first voltage of feedback-current and the second voltage of feedback-current;

an operational amplifier, which has a negative input end connected both to the output of said operational transconductance amplifier and the output of said differential amplifier and a positive input end receiving a second reference voltage, for producing an output voltage in relation to the inputs to the negative input end and positive input end thereof;

a feedback network connecting the output of the operational amplifier to the negative input end of said operational amplifier; and a comparator, which has a negative input end connected to the output of said operational amplifier and a positive input end connected to a triangle-wave signal, for producing a square-wave signal with a pulse width in relation to the voltage of feedback-voltage, the first voltage of feedback-current, and the second voltage of feedback-current from the bulk regulator, the output of said comparator being input to the bulk regulator so as to cause the bulk regulator to produce an output voltage in proportion to the pulse width of the output square-wave signal from said comparator.

9. The pulse-width controller of claim 8, wherein said feedback network is a resistor.

10. The pulse-width controller of claim 8, wherein said differential amplifier is a differential voltage-input current-output amplifier.

11. A switching regulator, comprising:

a bulk regulator for producing an output voltage in a fixed level and an output current in a desired level;

means for obtaining a voltage of feedback-voltage indicative of a change in the output voltage of the bulk regulator;

means for obtaining a first voltage of feedback-current and a second voltage of feedback-current indicative of a change in the output current of the bulk regulator;

an operational transconductance amplifier, which has two input ends respectively receiving a first reference voltage and the voltage of feedback-voltage, for producing a first output current proportional to the difference between the first reference voltage and the voltage of feedback-voltage;

a differential voltage-input current-output amplifier, which has two input ends respectively receiving the first voltage of feedback-current and the second voltage of feedback-current, for producing a second output current proportional to the difference between the first voltage of feedback-current and the second voltage of feedback-current;

an operational amplifier, which has a first input end connected both to the output of said operational transconductance amplifier and the output of said differential amplifier and a second input end receiving a second reference voltage, for producing an output voltage in relation to the inputs to first and second input ends thereof;

a feedback network connecting the output of the operational amplifier to the negative input end of said operational amplifier; and a comparator, which has two input ends respectively connected to the output of said operational amplifier and a triangle-wave signal, for producing a square-wave signal with a pulse width in relation to the voltage of feedback-voltage, the first voltage of feedback-current, and the second voltage of feedback-current from the bulk regulator, the output of said comparator being input to the bulk regulator so as to cause the bulk regulator to produce an output voltage in proportion to the pulse width of the output square-wave signal from said comparator.

12. The pulse-width controller of claim 11, wherein said feedback network is a resistor.

13. The pulse-width controller of claim 11, wherein said differential amplifier is a differential voltage-input current-output amplifier.

14. The pulse-width controller of claim 11, wherein said means for obtaining the first voltage of feedback-current and the second voltage of feedback-current includes a resistor coupled between the output of said bulk regulator and a load in such a manner that the potentials at both ends of said resistor are taken respectively as the first voltage of feedback-current and the second voltage of feedback-current.

15. A pulse-width controller for use in a switching regulator having a bulk regulator for producing an output voltage in a fixed level and an output current in a desired level, comprising:

means for obtaining a voltage of feedback-voltage indicative of a change in the output voltage of the bulk regulator;

means for obtaining a first voltage of feedback-current and a second voltage of feedback-current indicative of a change in the output current of the bulk regulator;

an operational transconductance amplifier, which has two input ends respectively receiving a first reference voltage and the voltage of feedback-voltage, for producing a first output current proportional to the difference between the first reference voltage and the voltage of feedback-voltage;

a differential voltage-input current-output amplifier, which has two input ends respectively receiving the first voltage of feedback-current and the second voltage of feedback-current, for producing a second output current proportional to the difference between the first voltage of feedback-current and the second voltage of feedback-current;

an operational amplifier, which has a first input end connected both to the output of said operational transconductance amplifier and the output of said differential amplifier and a second input end receiving a second reference voltage, for producing an output voltage in relation to the inputs to first and second input ends thereof;

a feedback network connecting the output of the operational amplifier to the negative input end of said operational amplifier; and a comparator, which has two input ends respectively connected to the output of said operational amplifier and a triangle-wave signal, for producing a square-wave signal with a pulse width in relation to the voltage of feedback-voltage, the first voltage of feedback-current, and the second voltage of feedback-current from the bulk regulator, the output of said comparator being input to the bulk regulator so as to cause the bulk regulator to produce an output voltage in proportion to the pulse width of the output square-wave signal from said comparator.

16. The pulse-width controller of claim 15, wherein said feedback network is a resistor.

17. The pulse-width controller of claim 15, wherein said differential amplifier is a differential voltage-input current-output amplifier.

18. The pulse-width controller of claim 15, wherein said means for obtaining the first voltage of feedback-current and the second voltage of feedback-current includes a resistor coupled between the output of said bulk regulator and a load in such a manner that the potentials at both ends of said resistor are taken respectively as the first voltage of feedback-current and the second voltage of feedback-current.

* * * * *